United States Patent
Hopkins et al.

(10) Patent No.: US 7,323,699 B2
(45) Date of Patent: Jan. 29, 2008

(54) APPARATUS AND METHOD FOR MODIFYING AN OBJECT

(75) Inventors: Barry F. Hopkins, Hobe Sound, FL (US); David J. Ray, Agoura Hills, CA (US); Jeffrey E. LeClaire, Boca Raton, FL (US); Roy White, Wellington, FL (US)

(73) Assignee: Rave, LLC, Delray Beach, FL (US)

( * ) Notice: Subject to any disclaimer, the term of this patent is extended or adjusted under 35 U.S.C. 154(b) by 0 days.

(21) Appl. No.: 11/047,877

(22) Filed: Feb. 2, 2005

(65) Prior Publication Data
US 2006/0169913 A1    Aug. 3, 2006

(51) Int. Cl.
G01N 13/16    (2006.01)
(52) U.S. Cl. .............................. 250/492.2; 250/492.1; 250/492.3; 250/306; 73/105
(58) Field of Classification Search .............. None
See application file for complete search history.

(56) References Cited

U.S. PATENT DOCUMENTS

| | | | |
|---|---|---|---|
| 3,991,296 A * | 11/1976 | Kojima et al. ......... | 219/121.68 |
| 4,037,075 A | 7/1977 | Pugsley et al. ...... | 219/121 LM |
| 4,379,022 A * | 4/1983 | Melcher et al. ............... | 216/94 |
| 4,413,020 A * | 11/1983 | McKee et al. ............... | 427/555 |
| 4,414,059 A | 11/1983 | Blum et al. ............... | 156/659.1 |
| 4,568,409 A | 2/1986 | Caplan ....................... | 156/643 |
| 4,697,041 A | 9/1987 | Okaniwa et al. ............. | 136/244 |
| 4,877,481 A | 10/1989 | Fukuda et al. ............... | 156/643 |
| 4,987,855 A * | 1/1991 | Ahlgren ....................... | 118/722 |
| 5,183,534 A | 2/1993 | FjAre et al. ................. | 156/668 |
| 5,298,760 A | 3/1994 | Fuchs et al. ............. | 250/492.3 |
| 5,432,015 A | 7/1995 | Wu et al. ..................... | 428/690 |
| 5,460,687 A | 10/1995 | Douglas ....................... | 216/48 |
| 5,569,398 A | 10/1996 | Sun et al. .............. | 219/121.68 |
| 5,569,399 A | 10/1996 | Penney et al. ......... | 219/121.69 |
| 5,641,391 A * | 6/1997 | Hunter et al. .................. | 205/80 |
| 5,679,472 A | 10/1997 | Wu et al. .................... | 428/690 |
| 5,683,547 A * | 11/1997 | Azuma et al. .............. | 438/695 |
| 5,702,565 A | 12/1997 | Wu et al. ................. | 156/643.1 |
| 5,824,374 A | 10/1998 | Bradley, Jr. et al. ........ | 427/555 |
| 5,830,376 A | 11/1998 | Bohlke et al. ................ | 216/65 |
| 5,932,118 A | 8/1999 | Yamamoto et al. .... | 219/121.66 |
| 6,007,969 A | 12/1999 | Hatakeyama et al. ....... | 430/323 |

(Continued)

FOREIGN PATENT DOCUMENTS

JP    359067634    *    4/1984    .......... 257/E21.214

(Continued)

OTHER PUBLICATIONS

M. Datta, et al., "Laser Etching Of Metals In Neutral Salt Solutions", Appl. Phys. Lett. 51(24), Dec. 14, 1987, pp. 2040-2042.

(Continued)

*Primary Examiner*—Nikita Wells
(74) *Attorney, Agent, or Firm*—Baker & Hostetler LLP

(57) ABSTRACT

A method and apparatus includes positioning a reactant on a surface in specific location and then directing an energy source from a device at the reactant such that it modifies the surface to either remove material or add material.

23 Claims, 11 Drawing Sheets

U.S. PATENT DOCUMENTS

| | | | |
|---|---|---|---|
| 6,063,695 A | 5/2000 | Lin et al. | 438/462 |
| 6,337,479 B1 | 1/2002 | Kley | |
| 6,353,219 B1 | 3/2002 | Kley | |
| 6,395,650 B1 * | 5/2002 | Callegari et al. | 438/785 |
| 6,403,388 B1 | 6/2002 | Birdsley et al. | |
| 6,555,016 B2 | 4/2003 | Lai | 216/18 |
| 6,635,311 B1 | 10/2003 | Mirkin et al. | |
| 6,674,074 B2 | 1/2004 | Schwartz | |
| 6,679,996 B1 | 1/2004 | Yao | 216/40 |
| 6,709,720 B2 | 3/2004 | Hayakawa et al. | 427/555 |
| 6,737,646 B2 | 5/2004 | Schwartz | |
| 6,827,979 B2 | 12/2004 | Mirkin et al. | |
| 6,998,689 B2 | 2/2006 | Kley | |
| 7,005,389 B2 * | 2/2006 | Ko et al. | 438/758 |
| 2003/0068446 A1 | 4/2003 | Mirkin et al. | |
| 2003/0157254 A1 | 8/2003 | Mirkin et al. | |
| 2004/0008330 A1 | 1/2004 | Mirkin et al. | |
| 2004/0028814 A1 | 2/2004 | Mirkin et al. | |
| 2004/0037959 A1 | 2/2004 | Mirkin et al. | |
| 2005/0016954 A1 * | 1/2005 | Hamann et al. | 216/62 |
| 2005/0247874 A1 * | 11/2005 | Ando et al. | 250/306 |

FOREIGN PATENT DOCUMENTS

| | | | |
|---|---|---|---|
| JP | 401295424 | * 11/1989 | 216/66 |
| JP | 2001319923 | * 11/2001 | |
| WO | WO2004/023490 A2 | 3/2004 | |

OTHER PUBLICATIONS

R.J. VonGutfeld, et al., "Laser Enhanced Etching in KOH", Appl. Phys. Lett. 40(4), Feb. 15, 1982, pp. 352-354.

Y.S. Shin, et al., "Laser-Assisted Etching of Titanium Foil in Phosphoric Acid for Direct Fabrication of Microstructures", Journal of Laser Applications, 15(4), Nov. 2003, pp. 240-246.

P.A. Moskowitz, et al., "Laser Micromachining of Polyimide Materials", Polyimides, vol. 1, 1984, pp. 365-376.

R.J. vonGutfeld et al., "Electrochemical Microfabrication by Laser-Enhanced Photothermal Processes", 42(5), 1998, pp. 1-12.

B.W. Hussey, et al., "Role of Bubbles in Laser-Assisted Wet Etching", Appl. Phys. Lett. 58(24), Jun. 17, 1991, pp. 2851-2853.

Edward K. Yung, et al., "Laser-Assisted Etching of Manganese-Zinc-Ferrite", J. Electrochem. Soc., vol. 136, No. 3, Mar. 1989, p. 665.

A. Aliouchouche, et al., "Laser Chemical Etching of Copper Films", SPIE, vol. 2403, pp. 425-2403.

R.J. vonGutfeld, et al., "Laser Chemical Etching of Metals in Sodium Nitrate Solutions", J. Appl. Phys. 64(10), Nov. 15, 1988, pp. 5197-5200.

R. Nowak, et al., "Laser Chemical Etching of Metals in Liquids", Materials and Manufacturing Processes, vol. 9, No. 3, pp. 429-446, 1994.

* cited by examiner

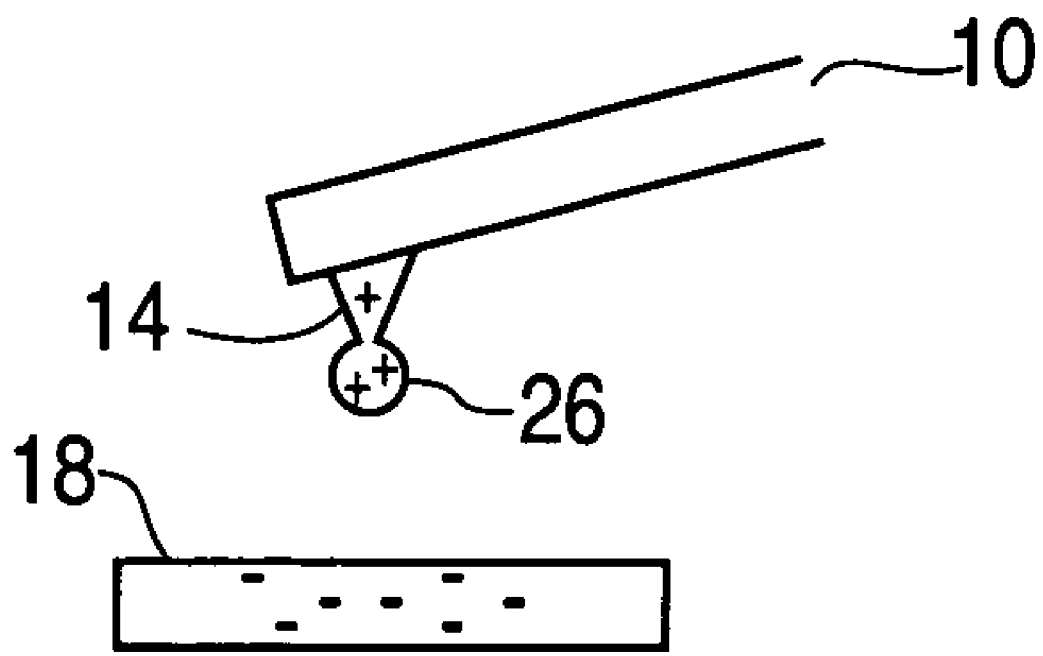

APPARATUS AND METHOD FOR MODIFYING AN OBJECT

FIELD OF THE INVENTION

The present invention relates generally to the alteration of material with a relative high degree of volumetric and positional accuracy. More specifically, the present invention relates to the removal and addition of material from substrates and items used in the semiconductor industry such as in the modification of semiconductor wafers and photomasks, which are used in photolithography process, the creation of semiconductors and micro and nano structures. The invention can make substrate alterations with dimensions in the nanometer and larger range and relative to surfaces and surface features with nanometer positional accuracy (X, Y and Z).

BACKGROUND OF THE INVENTION

In modifying and fabricating wafers, semiconductor die, photomasks and flat panel display/microdisplay devices for the semiconductor industry and other industries as well as correcting defects in masks used for processing of semiconductors, it is sometimes necessary to create small holes and other shapes that are relatively deep compared to their diameter or surface area. It is also sometimes necessary to create small holes and shapes relative to other device features with a high positional accuracy. With regard to holes, high aspect ratio holes are difficult to create. Note that, the ratio of the depth to width is referred to as the aspect ratio.

Attempts to overcome the difficulty associated with high aspect ratio structures have been relatively unsuccessful. Generally, these solutions either bore material out of the sample using particle beams such as ion beams, electron beams or laser beams. For example, U.S. Pat. No. 6,403,388 to Birdsley et al. discloses a method of using ion beams for this purpose. Such beam devices are also used to deposit material on the sample surfaces by introducing gasses into the beam. However, there are distinct disadvantages with these solutions.

U.S. Pat. No. 6,827,979, U.S. Pat. No. 6,635,311 as well as U.S. patent application Ser. No. 10/449,685, U.S. patent application Ser. No. 10/442,188, U.S. patent application Ser. No. 10/465,794, U.S. patent application Ser. No. 10/301,843, U.S. patent application Ser. No. 10/261,663 to Mirkin et al. teach methods of using scanning probe microscopes to add material to objects in small dimensions. These teachings show chemical techniques as the mechanisms for the additive process. These teaching do not include the activation of the additive materials by the use of electromagnetic, particle beam or gaseous materials. The use and apparatus of activation means described by the applicants herein results in substantially more versatility in applicant's invention.

U.S. Pat. Nos. 6,737,646 and 6,674,074 to Schwartz disclose adding material to an object by coating a tip and applying that coating to an object with an atomic force microscope. The invention further teaches a chamber for containing gasses. However, the invention has a distinct disadvantage in that at no point is the coating or material activated with an energy device. By including an energy device, the time to add the material to an object is significantly reduced.

When using ion beams to attempt material removal, the ions may imbed themselves in the sample or device to varying depths. As a result, the device becomes unusable because the device properties may be changed by the presence of the imbedded ions. The introduction of gasses into an ion beam also poses additional challenges in containment in and the selection of suitable gasses in the ion beam chamber.

With electron beams, controlling the position of the beam becomes difficult if the sample begins to develop charge. This phenomenon occurs when the electron beam strikes a non-conductive or poorly conductive substrate surface. As a result, the accuracy of this method becomes a serious concern for the end user. The use of such beams can cause uncontrolled damage, which could render the target device unusable. The introduction of gasses into an electron beam also poses challenges in the containment in and the selection of suitable gasses in the electron beam chamber.

With laser light, the size of the hole may be limited by the size of the achievable focus spot. In cases where material modifications smaller than the nominal focus spot are achieved, the depth of removal, and therefore the aspect ratio, is limited Laser light then only becomes a partial solution with limited applications due to the limitations of the focused light beam wavelength.

Additionally, in semiconductor processing and evaluation, physical access to subsurface features may also be needed. A small diameter hole or small area for holes that are not round, is desirable to prevent destruction or damage to features in the device that are adjacent to the hole. None of the prior art solutions are able to achieve this task with a relative degree of accuracy and precision.

Accordingly, a technique that is able to modify a sample such as a semiconductor with high positional accuracy and volumetric control is needed. There is also a need to be able to modify the semiconductor or target device to add material as required by the end user. There is also a need to be able to remove varying levels of materials without greatly affecting adjacent areas. The combination of high aspect ratio features with high positional accuracy, limits the affect to adjacent areas.

SUMMARY OF THE INVENTION

The foregoing needs are met, to a great extent, by the present invention, wherein in one aspect an apparatus is provided that in some embodiments permits an object such as semiconductor device to be modified such that material is removed or added. The present invention accomplishes this task by placing a reactant on the device to be modified and subjecting the reactant to a form of energy such that the reactant is able to modify the surface as desired. The reactant is uniquely selected for the desired task based upon the composition of the device. The energy form the mentioned source in the various embodiments of the present invention may be light energy, acoustic energy, or energy in the form of heat. Alternately the energy may be particle beam energy such as electrons, ions or other atomic particles. The reactant may be activated by introducing a gas into the area around the reactant.

The reactant chosen depends on whether the need is to remove material from the sample or whether material is to be added to the sample. The accurate placement of the reactant is typically accomplished with a scanning probe microscope. Scanning probe microscopes are a class of microscopes that use a probe assembly comprising a very fine tip on a probe. The probe assembly is guided in the X, Y, and Z directions using a very accurate positioning mechanism. These microscopes typically make use of some particular interaction between the probe and the surface of a sample. For example, a scanning tunneling microscope places a small bias voltage between the probe tip and the sample. This microscope then detects the currents that flow to or from the tip to the sample. Another type of scanning probe microscope is a scanning force microscope. This microscope utilizes a very sharp tip on the probe assembly. The tip is mounted on a cantilever. Deflections of the cantilever caused by the attractive or repulsive interatomic forces acting on the tip are monitored. Other types of scanning probe microscopes use capacitive or magnetic detection mechanisms. The invention described here typically shows a scanning force microscope, but other types of scanning probe microscopes can function equally well in many of the embodiments described.

In accordance with one embodiment of the present invention, a method for modifying an object includes positioning a reactant on the sample or an object and directing energy towards the reactant, wherein the energy is configured to activate the reactant such that it modifies the sample or object. The reactant is chosen or selected based upon the composition of the sample. The sample can be modified either by removing material or adding material.

In accordance with another embodiment of the present invention, an apparatus for modifying an object includes a reactant that is positioned on the object and an energy device configured to direct its output at the reactant in order to modify the object. This embodiment can further include an assembly that is configured to position the reactant on the object.

In accordance with yet another embodiment of the present invention, a product produced by the process of modifying a sample includes positioning a reactant on the sample and directing and energy source towards the reactant, wherein the energy along with the reactant is configured to modify the sample. The sample is modified by removing material or adding material.

In yet another embodiment of the invention, the reactant, when in fluid state, may be delivered to the surface of a sample by directing or forcing the fluid reactant through a channel formed in the cantilever and tip assembly. U.S. Pat. Nos. 6,337,479 and 6,353,219 to Kley, which are hereby incorporated by reference, describes a fluid delivery system using a channel in the cantilever and tip of a scanning force microscope.

There has thus been outlined, rather broadly, certain embodiments of the invention in order that the detailed description thereof may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the concept upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIG. 7 illustrates an electrostatic charge on the tip and reactant as well as an opposite electrostatic charge on the target device.

DETAILED DESCRIPTION

Figure 1A:
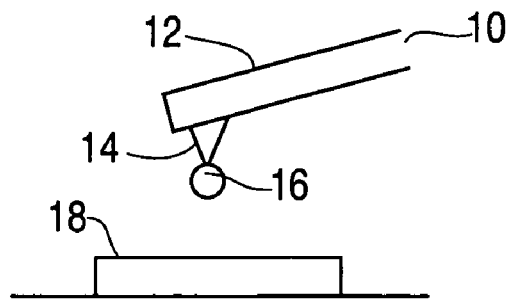
FIG. 1A illustrates a scanning probe microscope probe assembly with an amount of subtractive reactant on the probe tip positioned above the surface of a target device.

The invention will now be described with reference to the drawing figures, in which like reference numerals refer to like parts throughout. An embodiment in accordance with the present invention utilizes a small amount of a liquid such as a chemical or a particle of solid material, which is referred to as a reactant to modify a surface of an object. This droplet or particle is typically placed on the sample by a probe with a small point.

An embodiment of the present inventive apparatus and method is illustrated in FIG. 1A, which shows a scanning probe microscope probe assembly with an amount of subtractive reactant on the probe tip above the surface of a target device. In this figure, a scanning probe microscope probe assembly 10 includes a probe lever 12 and a probe tip 14. The scanning probe microscope probe assembly 10 is used, in the preferred embodiment, to precisely and accurately place a reactant 16 on a target device surface 18. To do this, the reactant 16, in this instance a subtractive or removal reactant, is placed or located on the probe tip 14. Once it is placed on the probe tip 14, the probe tip 14, with attached reactant 16, is then moved into the desired location over and then onto the device surface 18.

The probe tip 10 can be of the type used in a probe microscope. The accurate positioning of such probes over and on the sample can be achieved by use of a probe microscope device. In this manner, the reactant 16 is placed on the target device surface 18 of the sample with a high degree of precision, such as to the nanometer range, relative to the surface or surface features. The reactant 16, in the preferred embodiment, can be in the size range of from 1 square nanometer to 60 square nanometers or larger.

Figure 1B:
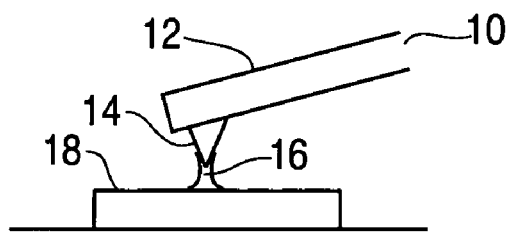
FIG. 1B illustrates a scanning probe microscope probe assembly with an amount of subtractive reactant on the probe tip in proximity of the target device with the reactant wetting to the surface of the target device surface.

FIG. 1B shows a scanning probe microscope probe assembly 10 with an amount of reactant 16, subtractive, on the probe tip 14 in proximity of the target device with the reactant wetting to the surface of the target device surface 18. In the preferred embodiment of the present invention, the reactant 16 is generally in liquid form. Surface forces (i.e. surface tension and adhesion) are relied upon to cause the reactant 16 to adhere to the probe tip 10 of a scanning force microscope while the reactant 16 is transported to the target device surface 18 or substrate. When reactant 16 is brought sufficiently close to surface 18 the reactant 16 will transfer to the surface 18 via capillary action. In this case, the tip material and the reactant 16 are selected from a group of materials and reactants where the tip material is at least partially hydrophilic to the reactant 16. In addition, in this case, the substrate material may be hydrophilic to facilitate transfer of the reactant 16 from the tip 14 to the substrate. The selection of tip material and reactant 16 in this embodiment is such that the tip 14 would resist chemical reaction with the reactant 16. In subsequent embodiments the tip material and reactant would be selected such that a mild or possibly strong reaction between the tip 14 and reactant 16 occurs.

Figure 8A:
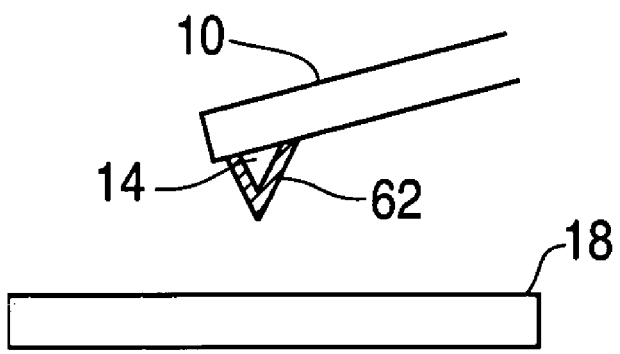
FIG. 8A illustrates a probe tip coated with reactant.
Figure 8B:
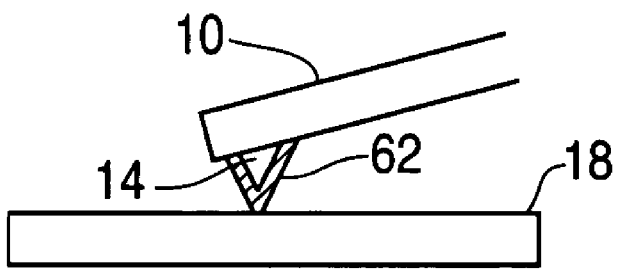
FIG. 8B illustrates a cantilever of a probe assembly lowering the probe tip to a surface of the sample.
Figure 8C:
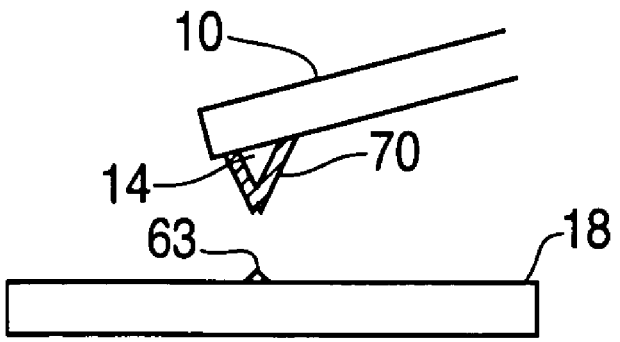
FIG. 8C illustrates reactant deposited on the surface of the sample after the probe is moved away from the surface.

In an alternative embodiment of the present invention shown in FIGS. 8 and 9, the probe tip 14 may contain the reactant or a component of the reactant. This is accomplished by coating the tip 60 prior to use. In this case, the tip, most likely, becomes a consumable in the process. Transfer of the reactant from the tip 60 is accomplished by touching the coated tip to the surface, see FIG. 8B, which positions the reactant 62 (part of the coating), see FIG. 8C. Transfer could also be accomplished by dipping the coated tip into another component of the reactant or into a solvent to dissolve part of the coating. This process would facilitate transfer of the coated tip reactant 74 to the substrate surface. Again, in these embodiments, electromagnetic (EM) energy is directed at the material transferred to the substrate to change the transferred material to its final desired form. For this embodiment, it is possible that the tip itself could be fabricated from the reactant material instead of applying a coating. Note that FIGS. 8 and 9 are described in additional detail herein.

In an alternate embodiment of the present invention, the transfer of reactant 16 to and from the tip may also be facilitated by creating an electric charge on the probe tip 14 and/or the substrate. In this embodiment, the reactant 16 is attracted by electrostatic force to the substrate and a dissolved portion of the sacrificial tip is transferred to the substrate along with the reactant. In a subsequent step the EM energy is directed at the transferred material and the transferred material changes to its final state.

Figure 1C:
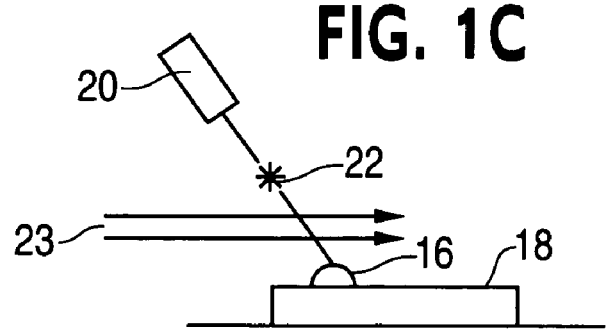
FIG. 1C illustrates the target device surface with an amount of subtractive reactant on the surface with a light beam directed towards the reactant.

FIG. 1C shows the target device surface 18 with an amount of subtractive reactant on the surface 18 with a light beam directed toward the reactant. In the preferred embodiment, this light beam includes an electromagnetic source 20 with an electromagnetic beam 22 emanating therefrom.

In order to remove debris that may be generated as the result of activating reactant 16, a gaseous transport medium 23 may be directed over sample surface 18. Alternately gaseous medium 23 may be used to activate reactant 16 with or without the use of source 20.

According to the preferred embodiment of the present invention, after placement of the reactant 16 on the device surface 18, electromagnetic energy (typically derived from a laser) is directed towards the sample surface on which the reactant 16 resides. The electromagnetic energy level is set such that the energy is sufficient to activate chemicals in the reactant 16 causing the chemical to etch the surface of the sample leaving a dimple approximately the size of the droplet or particle. By repeated applications of reactant 16 and electromagnetic energy, the dimple can be deepened until a predetermined depth or a detected depth is reached without significant enlargement of the diameter or surface area of the dimple and thus create a high aspect ratio hole. During an iterative process, it can be necessary to re-register the tip relative to surface or surface features. For example, it may be necessary to verify the depth of the removal spot to reach a specific final depth. In this case, the tip may be cleaned prior to verifying the position so that residual reactant is not placed or located onto the surface. One method to clean residual reactant from the tip is to dip the tip into a reactant solvent that does not substantially affect the tip material.

Figure 1D:
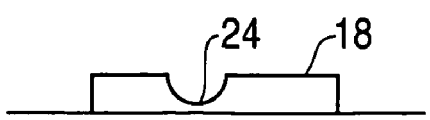
FIG. 1D illustrates the target device surface with a dimple that is the result of activation of the subtractive reactant on the surface. This activation is caused by the light beam.

FIG. 1D shows the target device surface 18 with a dimple 24 that is the result of activation of the subtractive reactant 16 on the surface caused by the light beam 22. In this instance, the user desired to remove material that inadvertently appeared or was created during the manufacturing process. If the material was a semiconductor device, this material could be an improper connection that could render the device inoperable. In many instances, the semiconductor device would have to be reconstructed. However, with the present invention, very small or minute features on the semiconductor device are able to be fixed. In many instances, the features are so small that there is no other suitable way to remove or reconstruct them. With the present invention, these features may be corrected in a substantially more accurate way and in a fraction of the time.

Figure 2A:
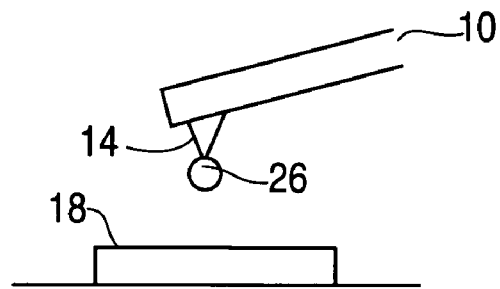
FIG. 2A illustrates a scanning probe microscope probe assembly with an amount of additive reactant on the probe tip above the surface of a target device.

FIG. 2A shows a scanning probe microscope probe assembly 10 with an amount of additive reactant 26 on the probe tip 14 above the surface of a target device surface 18. The process in creating additional material on a target device material is similar to that of removing material.

Figure 2B:
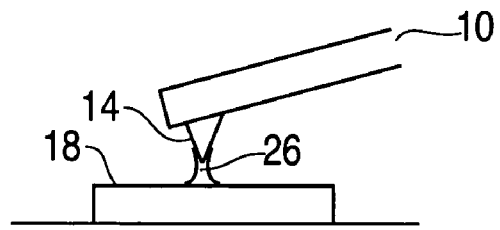
FIG. 2B illustrates a scanning probe microscope probe assembly with an amount of additive reactant on the probe tip in proximity of the target device with the reactant wetting to the surface of the target device surface.

After the additive reactant 26 is on the probe tip 14, the scanning probe microscope probe assembly 10 places or positions the additive reactant 26 in proximity of the target device surface 18 with the reactant wetting to the surface of the target device surface as in shown in FIG. 2B. The location to where the material is added, in the preferred embodiment, is known previously to the user. The user, upon desiring to add material to a surface, selects the additive reactant in conjunction with the problem that they are trying to solve. Upon selecting the additive reactant 26, the scanning probe microscope assembly 10 removes it from one location such as from a container to the target device surface 18 via the probe tip 14. If the tip material partially reacts to the reactant 16, then the tip may also partially dissolve into the reactant before the transfer of the reactant to the substrate occurs. A portion of the tip, the sacrificial tip, may dissolve in the liquid reactant such that the dissolved portion contributes to the build up of residue 28.

Figure 2C:
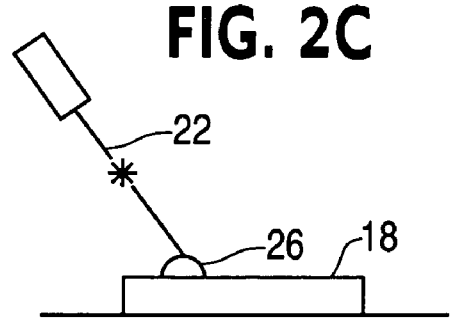
FIG. 2C illustrates the target device surface with an amount of additive reactant on the surface with a light beam directed toward the reactant.

FIG. 2C shows the target device surface 18 with an amount of additive reactant 26 on the surface with the light beam directed toward the reactant 26. Once the probe tip 14 places or positions the additive reactant 26 on the target device surface 18, the additive reactant 26 is subjected to the EM beam 18 from which it begins to react and begin the formation of additive material on the surface of the target device 18.

Figure 2D:
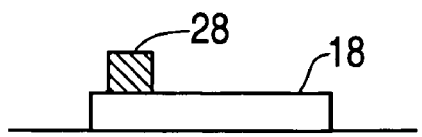
FIG. 2D illustrates the target device surface with a bump that is the result of activation of the additive reactant on the surface. The activation is caused by the light beam.

FIG. 2D shows the target device surface 18 with a protrusion formed thereon. A bump of residue 28 is created from the activation of the additive reactant 26 on the surface caused by the EM beam 22. Once the residue 28 is created, the technician can create or add additional residue matter if needed or remove all or portions of the residue 28 through the method described in FIGS. 1A-1D.

The droplet or particle leaves a residue 28 on the device after being activated by the electromagnetic energy. This residue 28 may act as a conductor or as an insulator. If the device is a photo-mask, the residue may act as an absorber of light.

The source EM beam 22 is typically a laser, a noncoherent light source, or in an alternate embodiment high frequency radio waves. A laser or electromagnetic source that is tunable over a range of wavelengths is desirable in certain applications. With such a laser, the wavelength is tuned to excite the reactant to a state whereby it would etch or remove material of small areas on the sample or excites the reactant to a state that would accelerate the rate of material removal.

Two mechanisms are used to remove from or deposit material on the device. The first, which is the preferred embodiment, is a photo-thermal effect. In this mechanism, the reactant is excited by EM energy to cause a thermal increase in the reactant. This thermal increase can cause the reactant to etch more quickly. Alternately, employing the photo-thermal effect, the reactant may change to a solid residue that acts as a conductor, insulator, or as an opaque layer. The level of the EM energy is selected to excite the reactant to a level that increases the speed of the reactance without melting the device material.

The composition of the reactant 16 may be chosen such that it would enter a state of excitation sufficient to cause removal of material from the device in a chosen location and would not affect material surrounding that location.

Alternately, the composition of the reactant 26 would be chosen to deposit a residue that exhibited the desired properties, and again the excitation is selected to reduce the reactant 26 to residue without causing a change in the device material.

In an alternative embodiment, the second mechanism to remove or deposit material is accomplished through a photochemical effect. In this mechanism, the reactant is excited in a manner that causes it to change in chemical property or composition. In one example, the reactant 16 may be changed by the energy source to an alternative material that chemically reacts with the device material. In another example, the reactant 26 can change forms, for example, from liquid to solid, by activating a catalyst in the reactant mixture that causes a chemical change of the reactant material. In this manner, a conducting or insulating material may be added to the device material. This compositional change may also be accompanied by a change in optical transmission of the reactant (e.g., from transparent to partially or completely opaque). Again, the level of the EM energy and or the wavelength is selected to excite the reactant to a level that induces chemical reaction without directly affecting the device material. In the case where the EM energy is light, a tunable laser or other source can be employed. The wavelength of the tunable source can then be adjusted to a wavelength that causes the reaction to proceed at an acceptable rate.

By selecting different reactants, sample materials could be removed without disturbing surrounding or underlying sample materials of a different type. Additionally, the selection of materials may be made such that certain types of layered samples may have a layer that can be used to stop the etching process. Thus, a so-called "etch stop" layer in the target device may be part of the process. This layer is composed of a material that does not react significantly to the etch solution or solid and therefore allows a process whereby the etch material along with the excitation energy reacts with the first layers encountered but the etch process will cease or be substantially slowed when the etch stop layer is reached.

Typical materials that may be used with the present invention are as follows:

| TIP MATERIALS | SUBSTRATE MATERIALS | REACTANTS |
|---|---|---|
| Silicon | Silicon | Potassium Hydroxide |
| Silicon Dioxide | Quartz | Sodium Hydroxide |
| Silicon Nitride | Silicon Dioxide | Sulfuric Acid |
| Carbon | Aluminum | Hydrofluoric Acid |
| Tantalum Nitride | Aluminum Oxide | Ferric Chloride |
| Silicon Carbide | Zirconium Oxide | Phosphoric Acid |
| Tungsten Carbide | Molybdenum Silicide | Sodium Nitrate |
| | Chromium | Nitric Acid |
| | Tantalum Nitride | Perchloric Acid |
| | Silicon doped with group II or III elements | |
| | Silicon doped with group IV, V or VI elements | |
| | Titanium | Ceric Amonium Nitrate |
| | Copper | Sodium Chloride |
| | Iron, Steel | |
| | Germanium | Potassium Sulfate |
| | Carbon | Buffered HydrofluoricAcid Combinations of Hydrofloric Nitric, and Sulfuric Acids |

These lists are not all-inclusive but are representative of types of elements, oxides and metals for tips and substrates and hydroxides, acids, and compounds for reactants.

One example of the present invention would be to remove material from a surface of a device such as silicon. Reactants that have been found to produce removal of silicon are potassium hydroxide and sodium hydroxide. In the present invention, an amount of the reactant, potassium hydroxide, is taken from a source by the probe tip 14 of a scanning probe microscope assembly 10 and then placed in the desired position. Once into position, the amount of potassium hydroxide that is located on the surface is then subjected to the EM energy, which in this example is a focused argon ion laser with laser power of approximately 1.5 Watts. Once subject to the EM laser, removal of the materials is substantially constrained to the location of the potassium hydroxide by the probe tip 14.

It has been found that sodium nitrate serves generally as an effective removal reactant for metals. Phosphoric acid, sulfuric acid and potassium hydroxide serve as an effective removal reactant for stainless steel and titanium.

Figure 3A:
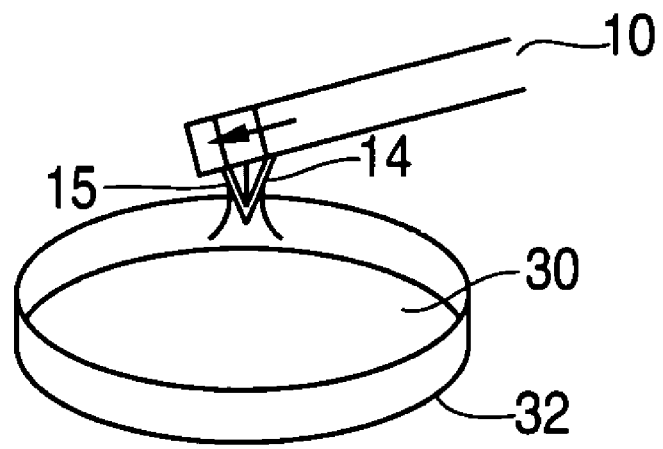
FIG. 3A illustrates a scanning probe microscope probe assembly drawing an amount of reactant from a pool of reactant.
Figure 3B:
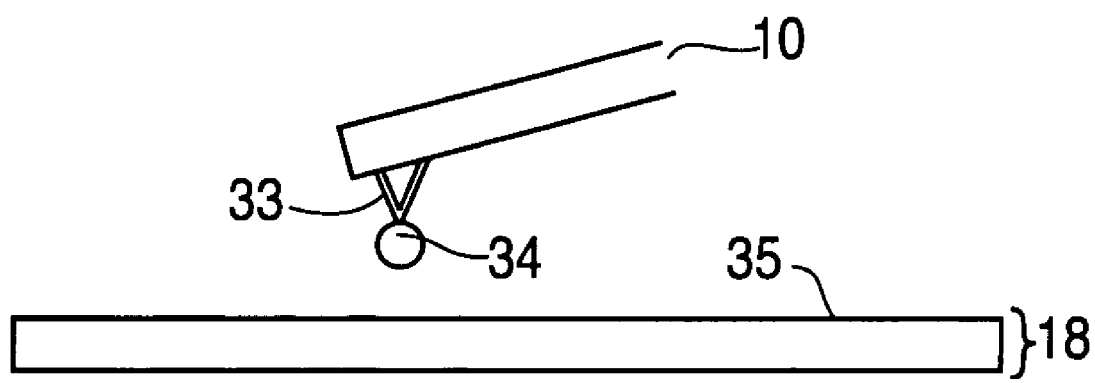
FIG. 3B illustrates the probe tip transporting an amount of reactant.

FIG. 3A shows a scanning probe microscope probe assembly 10 drawing an amount of reactant from a reactant pool 30, which is held in a reactant container 32. FIG. 3B shows the probe tip 14 carrying an amount of reactant. Surface forces are used, in the preferred embodiment, to cause reactant from the reactant container 32 to adhere to the probe tip 10 of a scanning force microscope assembly 10 while the reactant 16 is transported to the target device surface 18 or substrate. The tip material and the reactant 16 are selected from a group of materials and reactants where the tip material is at least partially hydrophilic to the reactant. Additionally, the substrate material may be hydrophilic to facilitate transfer of the reactant from the tip to the substrate.

Tip 14 can be coated with a hydrophobic insulator 33 and still able to attract reactant 30. In this method, the tip 14 may be charged opposite to a charge placed on reactant 30. When the charge difference is sufficiently great, reactant 30 will be attracted to tip 14 with sufficient force that cohesion and gravitational forces are overcome. Reactant 30 may then be transported to the sample 18. The insulator 33 prevents charge dissipation between reactant 30 and tip 14. As the tip 14 is brought close to sample 18, the charge difference between reactant 30 and sample 18 neutralizes and the hydrophobic nature of insulator 33 drives reactant 30 towards the sample 18. The reactant 30, in this embodiment, may be either a solid or a liquid.

Figure 9A:
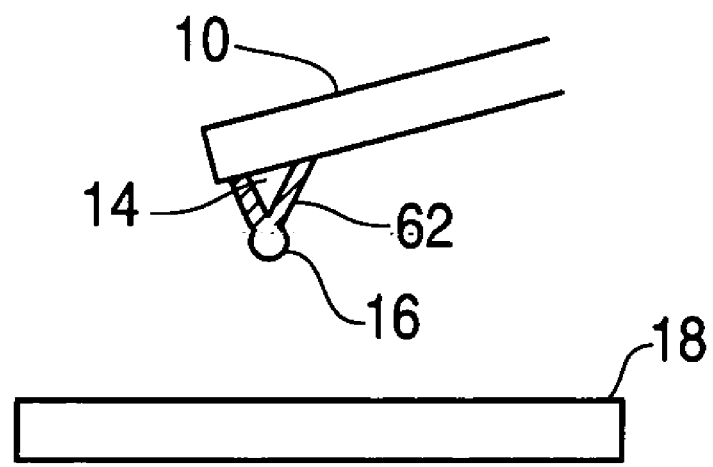
FIG. 9A illustrates a probe tip coated with reactant that has been dipped into a solvent liquid.

In an alternative embodiment, the tip 14 is coated with the reactant or a component of the reactant 34 or is fabricated out of reactant material. The reactant 34 can then be transferred to the surface 35 by direct contact of the tip 14 to the device surface, as shown in FIG. 8C. The tip 14 could also be placed into a liquid, in a similar manner as described for transfer of a liquid reactant, to complete the reactant mixture or aid in transfer of the reactant. In this embodiment, a portion of the tip coating is dissolved in the liquid, as shown in FIG. 9A and the resulting reactant transferred to the substrate with the reactant 34. In this embodiment, the tip would need to be replaced more frequently in order to effectively transfer the reactant 34.

In an alternate embodiment of the present invention, the transfer of reactant 16 to and from the tip may also be facilitated by creating electric charge on the tip and/or the substrate. Also, in this embodiment a portion of the sacrificial tip is transferred to the substrate. Subsequently, the EM energy is directed at the transferred material and the transferred material changes to its final state.

Figure 4A:
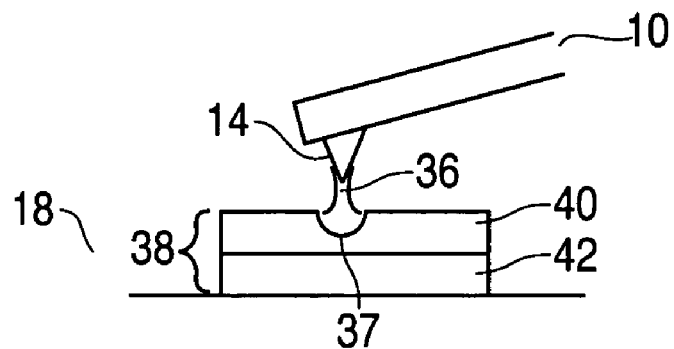
FIG. 4A illustrates a scanning probe microscope depositing reactant onto a surface dimple resulting from a previous application of subtractive reactant.

FIG. 4A shows a scanning probe microscope assembly 10 with the probe tip 14 depositing the subtractive reactant 36 onto a surface. In this figure, the reactant 36 is being deposited into a dimple 37 that was previously created with a previous application of the reactant 34. FIG. 4A includes a targeted device 38 that includes multiple layers of differing materials. These multiple layers are first device layer 40 and second device layer 42.

The dimple in the material 37, shown in FIG. 4A could also have been created by an alternative method, prior to using the reactant process for additional material removal. For example, the dimple 37 could have been created during the processes used to create the device. The dimple 37 could also have been created with the scanning probe tip 14 by direct tip to surface contact. Other means of creating the dimple 37 or pit include the use of an ion beam or laser beam. The predefined dimple could be used to help guide the reactant to the ideal location during placement. The location could also help constrain the reactant to the desired location during the removal or additive process. In addition, dimples predefined during fabrication of the device could have high positional accuracy relative to other non-accessible structure in the device.

The repeated application of the subtractive reactant 36 in FIG. 4A is done to achieve a clear connection to device layer two 42. Due to the thickness of the first device layer 40, multiple applications of the subtractive reactant 36 are needed to accomplish this goal.

Figure 4B:
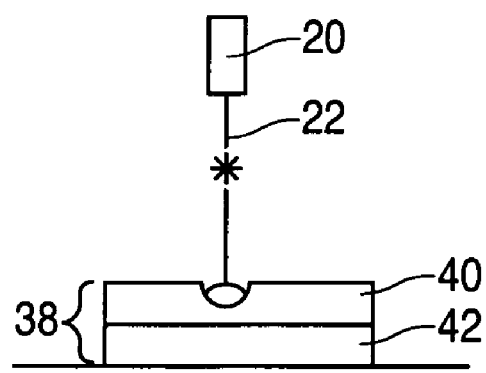
FIG. 4B illustrates an electromagnetic source directing a beam of energy toward the reactant.

In similarity to the FIG. 1A-1D, once the subtractive reactant 36 is positioned on the surface, which in this figure is the dimple creation, the EM energy and the resulting beam 22 is focused, as shown in FIG. 4B, at the subtractive reactant 36 in order to remove additional material of the first device layer 40.

Figure 4C:
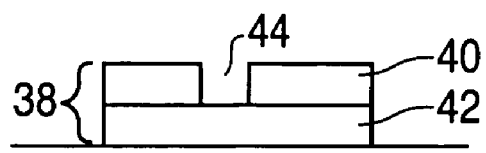
FIG. 4C illustrates the resulting void created by a second or subsequent deposition of reactant and a stop layer of material that is not reactive to the etchant.

FIG. 4C shows the resulting void 44 created by the repeated application of the subtractive reactant. Additionally, it is noted that because of the differing materials in the device layers, the second device layer 42 is a stop layer of material that is not reactive to the etchant. In other words, the reactant chosen for the first device layer 40 does not have the same effect of etching or removing material on the second device layer 42.

Figure 5A:
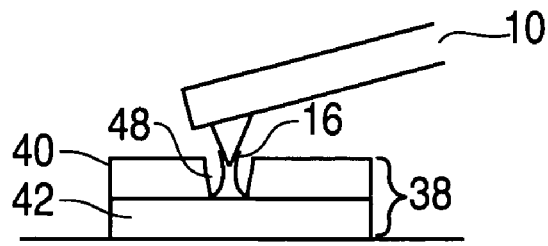
FIG. 5A illustrates a scanning probe microscope depositing additive reactant on to a surface dimple resulting from a previous application of subtractive reactant.

FIG. 5A shows a scanning probe microscope assembly 10 positioning reactant into a surface dimple 48. In this embodiment, the technician is attempting to create additional matter on a surface that resulted from a previous application of subtractive reactant 16.

FIG. 5A is the targeted device 38 as detailed in the FIGS. 4A-4C. As previously detailed, the target includes a first device layer 40 and a second device layer 42. Having removed the material as detailed in FIGS. 4A-4C, the technician now needs to complete the connection.

Figure 5B:
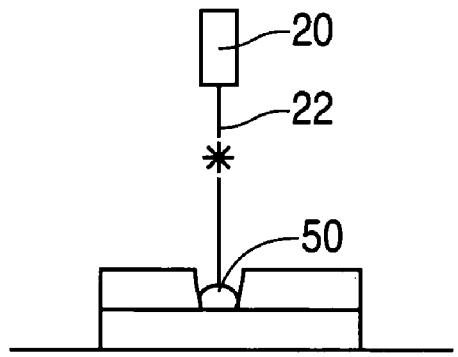
FIG. 5B illustrates an electromagnetic source directing a beam of energy toward the additive reactant.

FIG. 5B shows an electromagnetic source directing a beam 22 of energy towards the additive reactant 50. By subjecting the additive reactant 50 to the beam 22, a more rapid chemical reaction of the additive reactant 50 to the targeted surface is created.

Figure 5C:
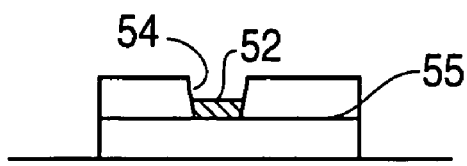
FIG. 5C illustrates the resulting partially filled void created by application of additive reactant on top of a stop layer of material.

FIG. 5C details the results of the beam on the additive reactant 50. The beam has caused the reactant to create a residue 52 that partially fills the void 54. A layer of material is now created by application of additive reactant 50 on top of a stop layer 55 of material.

Figure 5D:
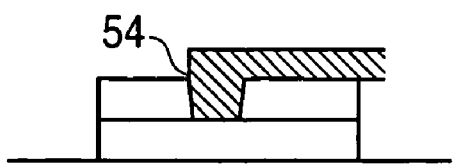
FIG. 5D illustrates the resulting filled void created by application of additive reactant.

FIG. 5D shows the resulting filled void 54 created by application of additive reactant 50. In this specific example, the additive reactant 50 can create a connection to another objection on the targeted device. For example, if the target device is a semiconductor, the filling of the void 54 with the additive reactant 50 could be the connection of one transistor to anther transistor.

As can be seen from the present invention, there are endless amounts of repair or corrections that can be made to a device. To create such a connection as that detailed in FIG. 5D, generally would require the complete creation of a new device. With the present invention, a company can reuse or edit the device by simply modifying the surface with the techniques disclosed therein.

Figure 6A:
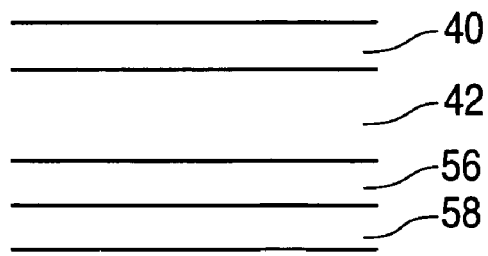
FIG. 6A illustrates a multi-layer device.

FIG. 6A illustrates a multi-layer device. In this figure, there are four layers, a first device layer 40, a second device layer 42, a third device layer 56 and a fourth device layer 58. The four layers, 40, 42, 56, 58 are respectively silicon dioxide ($SiO_2$), silicon (Si), silicon dioxide ($SiO_2$) and silicon (Si).

Figure 6B:
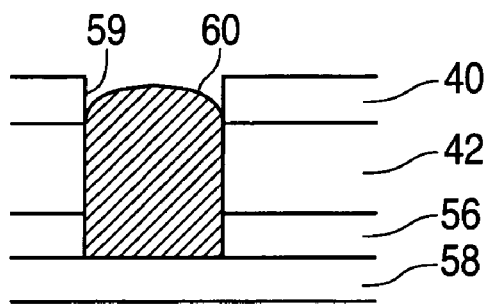
FIG. 6B illustrates the result of etching a hole in a sample with the hole filled with a nonconductive residue.

FIG. 6B illustrates a hole 59 that has been created through each of the first three layers 40, 42, 56. The hole 59, in this figure, is shown filled with a nonconducting plug 60. To create a path way through the first device layer 40, a reactant such as buffered hydrofluoric acid is placed on the layer by the scanning probe microscope assembly 10. Once positioned, a beam 22 is focused at the reactant in order to create etching or removal of the silicon dioxide material.

The buffered hydrofluoric acid reactant is not necessarily effective on the second device layer 42, silicon. Therefore, this layer acts as a stop layer and prevents the reactant from burrowing or etching into the second device layer 42.

If the second device layer 42 acts as a stop layer, then another reactant is chosen to continue the etching process through the device. For the second device layer 42, which is Si, a reactant that is effective at removing the materials is sodium hydroxide. Like the first device layer 40, the reactant is subjected to a beam 22 to remove the material. This process is continued until the necessary material is removed to reach the third device layer 56, which is silicon dioxide. To remove the material of the third device layer 56, the process, as in the first device layer 40, is repeated with buffered hydrofluoric acid as the removal reactant for the silicon dioxide.

Once the necessary material is removed through all the layers, a reactant is added in order to create a nonconductive residue 60. The nonconducting plug 60 in FIG. 6B is created in order to make an insulator for a subsequently created conducting plug.

Figure 6C:
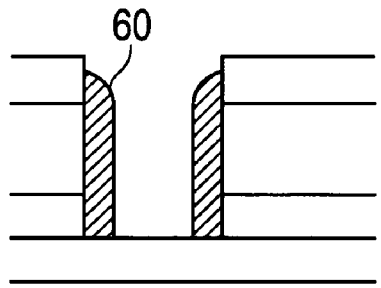
FIG. 6C illustrates the result of etching a hole in the nonconductive residue.

FIG. 6C shows the next step in which the nonconducting plug 60 further has a hole opened creating a path to the fourth device layer 58. As is seen in this figure, layer 42 is now insulated from layer 58.

Figure 6D:
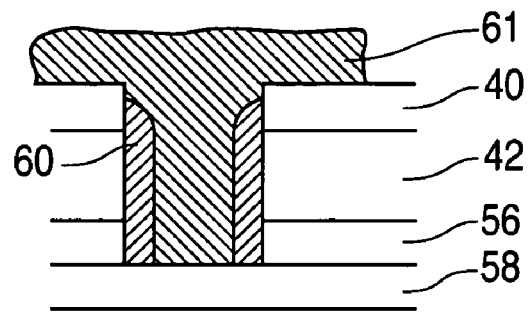
FIG. 6D illustrates the filled hole in the nonconductive reside. The fill residue in this illustration is conductive.

FIG. 6D shows that the hole created in the insulator 60 in filled with a conductive residue 61. The device to create residue is similar to that detailed in relation to FIGS. 5A-5D. The connection, in this figure, makes a direct connection from the fourth device layer 58, silicon, up through the third device layer 52, second device layer two 42 and device layer one 40. The residue 61 is then located across the upper surface of the first device layer one 40 and onto their intended connections.

FIG. 7 shows that an opposite charge may be placed on the tip 14 and reactant 26 and substrate 18. This causes reactant 26 to be attracted to substrate 18. After placement of charge on tip 14 and sample 18, probe 10 with reactant 26 is moved toward sample 18. When the distance between reactant 26 and sample 18 is sufficiently small coulomb forces will become greater than the surface forces holding reactant 26 to tip 14. At this distance reactant 26 will separate from tip 14 and move to sample 18.

FIG. 8A illustrates a reactive coating 62 on the probe tip 14, which is part of probe assembly 10. This figure depicts the probe assembly 10 before it is brought to sample surface 18.

FIG. 8B illustrates the probe tip 14 with reactive coating 62. Additionally, this figure depicts the cantilever 10 lowering the tip 14 to the sample surface 18.

FIG. 8C illustrates the instance when the probe tip 14 is raised from sample surface 18. As the figure depicts, once the probe tip 15 is removed an amount coating 63 remains on surface 18. This remnant of coating 63 becomes the reactant that is subsequently activated.

Figure 9B:
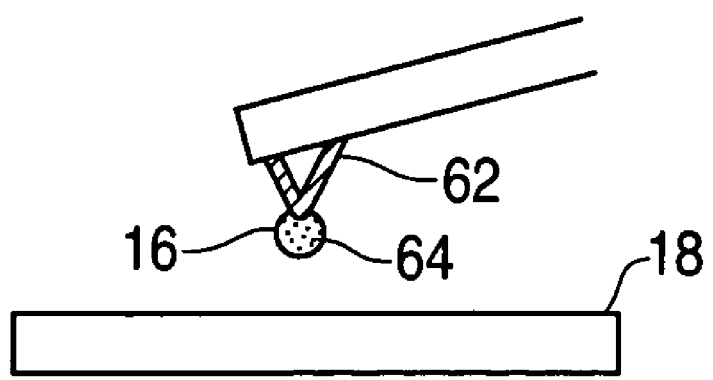
FIG. 9B illustrates a second droplet of reactant that occurs when a coated probe tip reacts with a first droplet of the reactant.

FIG. 9A illustrates the coated tip 14 that further includes a small amount or droplet of reactant 16. In this embodiment, the reactant 16 has reacted with the coating 62 to form a second reactant 64 as shown in FIG. 9B This mixture occurs as the droplet is transported from the source of reactant to the surface.

During the transportation of the reactant, this second reactant, in most instances, contains dissolved parts of coating 62. Once transported to the desired area, the second reactant 64 is placed or located on the sample surface 18.

Figure 10A:
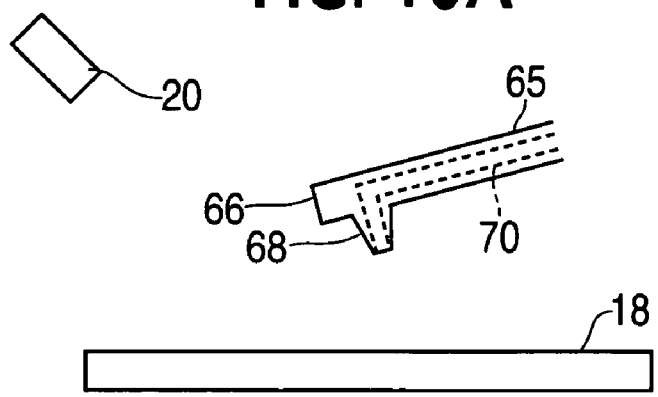
FIG. 10A illustrates a laser chemical machining system with a probe assembly that includes channels in the probe assembly for delivery of fluid to the surface of the sample.

FIG. 10A shows a probe assembly 65 including a cantilever 66 and a tip 68 in which the cantilever 66 and tip 68 have an interior channel 70. The interior channel 66 is depicted in this figure as dashed lines.

Figure 10B:
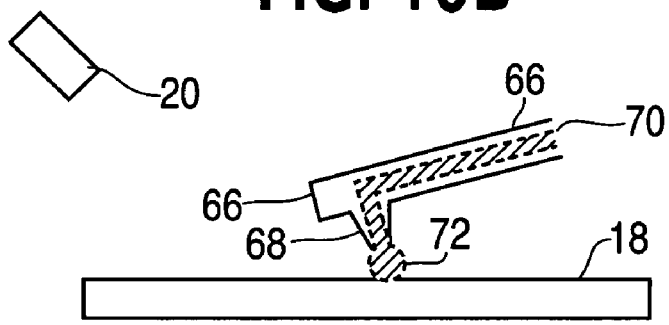
FIG. 10B illustrates the delivery of the fluid from the channel to the surface of the sample.
Figure 10C:
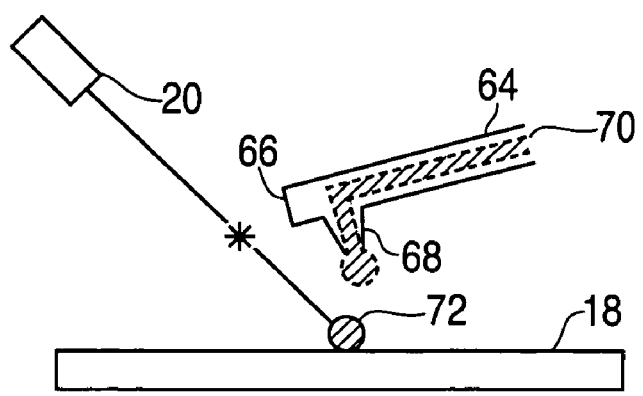
FIG. 10C illustrates an energy source activating the fluid after it has been deposited on the surface of the sample.

The channel 70 delivers a fluid reactant 72 as indicated in FIG. 10B through the channel 70 to tip 68 in preparation for delivery of fluid reactant 72 to sample surface 18. As shown in FIG. 10C, the laser 20 activates the drop of fluid reactant 72 after the reactant 72 is placed on sample surface 18. Depending on the type of reactant 72 selected, a portion of sample 18 is removed or a residue on sample 18 will remain as depicted and described in FIGS. 1A-1D and 2A-2D.

Figure 11A:
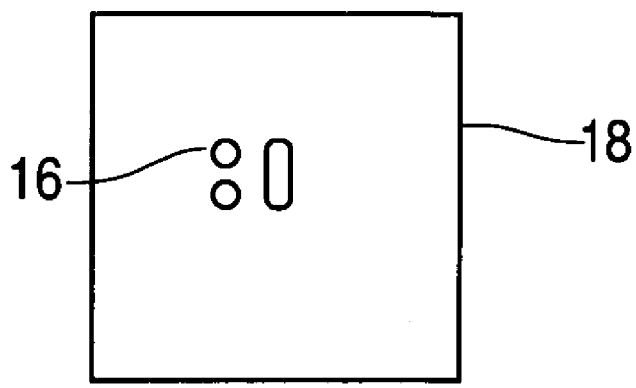
FIG. 11A illustrates placing multiple droplets of reactant on a sample surface.
Figure 11B:
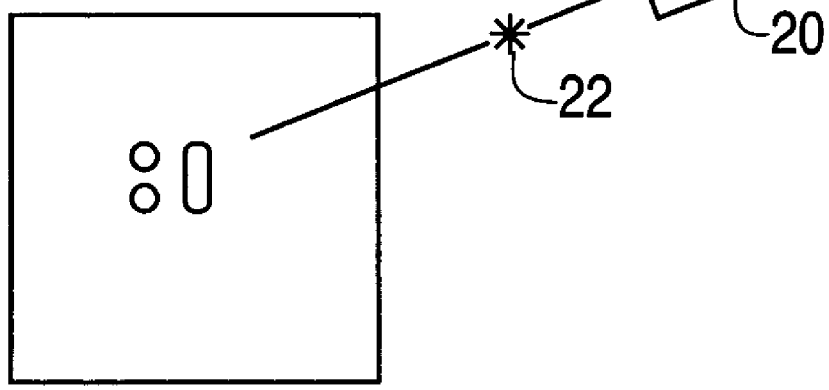
FIG. 11B illustrates activation of multiple droplets of reactant on the sample.
Figure 11C:
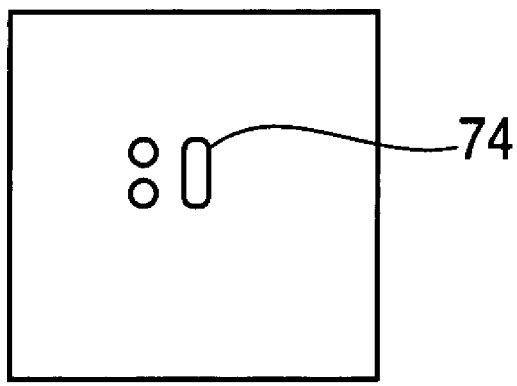
FIG. 11C illustrates a shape resulting from the placement and activation of droplets on a sample surface.

FIG. 11A is a top view of a substrate. This figure illustrates how specific shapes are created in accordance with an embodiment of the present invention. More specifically, this figure shows the creation of an approximate square void in the surface of sample 18. A number of droplets of reactant 16 are placed on the sample 18 by means of a tip (not shown). Electromagnetic source 20, as detailed in FIG. 11B, may activate the droplets one at a time or all together if the diameter of beam 22 is large enough to encompass all the droplets. If reactant droplets 16 have the sufficient viscosity then surface forces will be insufficient to pull them together and they may all be placed on sample 18. Reactant droplets 16 may then be activated all at once by laser beam 22. Again, if reactant 16 has viscosity, then instead of placing reactant 16 in the form of droplets reactant 18 may be drawn into lines of various shapes. Such repeated applications of reactant 16 as described here along with repeated applications of beam 22 will create a void shape 74, as detailed in FIG. 11C, with high aspect ratio walls of arbitrary depth in sample 18.

As can be seen, a wide variety of simple approximate shapes, such as rectangles can be created. The creation of more complex shapes may also be created using combinations of large and small rectangles, squares, circles and lines. Complex shapes may also be created in the depth as well as in the lateral dimensions. By extension, complex additive shapes may be created in elevation as well as laterally by the use of the additive reactants previous described. Also, by extension an array of approximately circular holes or shapes located with precision relative to each other or with precision relative to other features on sample 18 may be created. Again, the reactant creating the array may be activated at single locations sequentially or if the focused light spot is made large enough, the reactant may be activated in multiple locations simultaneously.

The many features and advantages of the invention are apparent from the detailed specification, and thus, it is intended by the appended claims to cover all such features and advantages of the invention, which fall within the true spirit, and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An apparatus for modifying an object, comprising:
   a moveable probe with a probe tip positioned adjacent to the object;
   a reactant that is positioned on the object; and
   an energy device configured to direct its output directly at the reactant in order to modify the object wherein the reactant is placed on the probe tip through an electrostatic process.

2. The apparatus as in claim 1, wherein the probe is included in an assembly that is configured to position the reactant on the object.

3. The apparatus as in claim 2, wherein the assembly is a scanning probe microscope.

4. The apparatus as in claim 3, wherein the reactant is positioned with a probe tip of the scanning probe microscope.

5. The apparatus as in claim 4, wherein the reactant is placed on the probe tip through a hydrophilic process.

6. The apparatus as in claim 1, wherein the energy device is an electromagnetic device.

7. The apparatus as in claim 1, wherein the energy device is a laser.

8. The apparatus as in claim 7, wherein the added material is linked to another portion of the object.

9. The apparatus as in claim 1, wherein the energy device is configured to directed radio waves at the sample.

10. The apparatus as in claim 1, wherein in the object is a single layered device.

11. The apparatus as in claim 1, wherein the object is comprised of at least two layers.

12. The apparatus as in claim 11, wherein one of the at least two layers is configured to act as a stop layer.

13. The apparatus as in claim 11, wherein the reactant is configured to removed material from one of the at least two layers and not react with the second of the at least two layers.

14. The apparatus as in claim 1, wherein the object is a semiconductor device.

15. The apparatus as in claim 1, wherein the reactant is configured to remove material from the object.

16. The apparatus as in claim 1, wherein the reactant is configured to add material to the object.

17. The apparatus as in claim 16, wherein the added material is a conductor.

18. The apparatus as in claim 16, wherein the added material is an insulator.

19. The apparatus as in claim 1, wherein the reactant is selected based upon the object.

20. The apparatus as in claim 1, wherein the energy device is configured to increase a reaction time of the reactant on the object.

21. The apparatus as in claim 1, further comprising a probe assembly and fluid delivery channel.

22. The apparatus as in claim 1, further comprising a debris removal means.

23. The apparatus of claim 1, further comprising the steps of placing reactant in multiple locations to create specific shaped features.

* * * * *